(12) United States Patent
Kim et al.

(10) Patent No.: US 7,554,118 B2
(45) Date of Patent: Jun. 30, 2009

(54) THIN FILM TRANSISTOR, FLAT PANEL DISPLAY HAVING THE SAME AND A METHOD OF FABRICATING EACH

(75) Inventors: Chang-Soo Kim, Suwon-si (KR); Tae-Wook Kang, Seongnam-si (KR); Chang-Yong Jeong, Suwon-si (KR); Jae-Young Oh, Suwon-si (KR); Sang-Il Park, Seoul (KR); Seong-Moh Seo, Suwon-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 533 days.

(21) Appl. No.: 11/124,124

(22) Filed: May 9, 2005

(65) Prior Publication Data

US 2005/0263761 A1   Dec. 1, 2005

(30) Foreign Application Priority Data

May 28, 2004   (KR) .................... 10-2004-0038528

(51) Int. Cl.
*H01L 29/04* (2006.01)
*H01L 21/00* (2006.01)
(52) U.S. Cl. .............. 257/72; 257/74; 257/E21.4; 438/149; 438/153; 438/164
(58) Field of Classification Search ............. 438/149, 438/153, 164; 257/72, 74, 75, E21.4, E21.615
See application file for complete search history.

(56) References Cited

U.S. PATENT DOCUMENTS

| 6,984,848 B2 * | 1/2006 | Liao et al. ............... 257/52 |
| 7,202,115 B2 * | 4/2007 | Hirano et al. ............ 438/149 |
| 2004/0004224 A1 * | 1/2004 | Han .............................. 257/88 |

FOREIGN PATENT DOCUMENTS

| JP | 03185735 | 8/1991 |
| JP | 2003100629 | 4/2003 |
| JP | 2003115497 | 4/2003 |
| JP | 2003131261 | 5/2003 |
| JP | 2004214546 | 7/2004 |
| KR | 1020040032401 | 4/2004 |
| TW | 573364 | 1/2004 |

* cited by examiner

*Primary Examiner*—Hsien-ming Lee
(74) *Attorney, Agent, or Firm*—H.C. Park & Associates, PLC (57) ABSTRACT

A TFT having a dual buffer structure, a method of fabricating the same, and a flat panel display having the TFT, and a method of fabricating the same are provided. The TFT includes a first buffer layer formed of an amorphous silicon layer on a substrate, a second buffer layer formed on the first buffer layer. The TFT also includes a semiconductor layer formed on the second buffer layer and a gate electrode formed on the semiconductor layer. The dual buffer structure provides better barrier to impurities diffusing from the substrate, and also acts as a black matrix to reduce unwanted reflections and is a source of hydrogen to passivate other layers.

19 Claims, 4 Drawing Sheets

THIN FILM TRANSISTOR, FLAT PANEL DISPLAY HAVING THE SAME AND A METHOD OF FABRICATING EACH

CROSS-REFERENCE TO RELATED APPLICATION

This application claims priority to and the benefit of Korean Patent Application No. 10-2004-0038528, filed May 28, 2004, the disclosure of which is incorporated herein by reference for all purposes as if fully set forth herein.

BACKGROUND OF THE INVENTION

1. Field of the Invention

The present invention relates to a thin film transistor (TFT), a method of fabricating the TFT, and a flat panel display having the TFT. More particularly, the present invention relates to a TFT having a dual buffer structure, a method of fabricating a TFT with a dual buffer structure, and a flat panel display having the TFT with a dual buffer structure.

2. Description of the Related Art

In general, a flat panel display may be classified as either a passive matrix type or an active matrix type based on its driving method, where the active matrix type has circuits using TFTs. TFT circuits are widely used in flat panel displays such as, for example, liquid crystal displays (LCD), organic electroluminescence displays (OELD), and so forth.

As silicon crystal fabrication technology advances, it has become possible to fabricate a polycrystalline silicon TFT among other TFTs at low temperatures similar to temperatures used to fabricate amorphous silicon TFTs. In addition, polycrystalline silicon has high electron and hole mobility as compared to amorphous silicon. Also, polycrystalline silicon may be implemented as a complementary metal-oxide semiconductor (CMOS) device, so that a TFT for driving a circuit and a TFT for driving a pixel may be formed on the same substrate at the same time.

A method for forming a polycrystalline silicon layer to be used as an active layer of a TFT typically includes depositing an amorphous silicon layer on an insulating substrate and crystallizing the amorphous silicon layer at a predetermined temperature to form a polycrystalline silicon layer therefrom. However, impurities located in the substrate before depositing the amorphous silicon layer will diffuse into adjacent semiconductor layers when the crystallization process is carried out. Such diffused impurities lead to degradation of the electrical properties of the resulting TFT. In addition, various crystallization defects occur in the polycrystalline silicon layer after the crystallization process is carried out. Furthermore, conductive layers formed in the TFT of the flat panel display cause a diffuse reflection of external light. Reflections of external light make it difficult to form a complete black in the flat panel display, and the contrast ratio of the display will be degraded due to such reflections.

Typically, at least one of the above mentioned problems is improved by preventing impurities in the substrate from diffusing into adjacent semiconductor layers. To prevent or reduce such impurity diffusion, a method of forming a buffer layer on a substrate has been typically used. Also, a passivation method has been used in order to reduce crystallization defects in the polycrystalline silicon layer. Additionally, the reflection of external light has typically been reduced and display contrast improved by forming a polarizer outside the display device, as well as by forming a black matrix inside the display device.

The formation of the buffer layer, the passivation process, the formation of the black matrix, and the arrangement of the polarizer solve the above-mentioned conventional problems, however, each of the above solutions have typically been performed by a different process. Such separation of processes causes the overall fabrication of the display device to be complicated. Additionally, as the number of process variables increases, the number of potential errors or failures in each manufacturing process also increases.

SUMMARY OF THE INVENTION

The present invention, therefore, solves the aforementioned problems associated with conventional devices by providing a flat panel display device having a TFT using an amorphous silicon layer as a buffer layer so that the buffer layer and an anti-diffuse reflection layer are simultaneously formed.

The present invention also provides a flat panel display device for enhancing a contrast ratio by reducing reflection of light due to metal electrodes in an emission region.

The present invention also provides a TFT having a passivation effect by using a hydrogenated buffer layer formed of amorphous silicon, and a flat panel display device having the same.

The present invention also provides a flat panel display device having a TFT using a patterned amorphous silicon layer as a buffer layer so that the buffer layer and a black matrix are simultaneously formed.

Additional features of the invention will be set forth in the description which follows, and in part will be apparent from the description, or may be learned by practice of the invention.

The present invention also discloses a thin film transistor (TFT) including a first buffer layer comprising amorphous silicon positioned on a substrate, and a second buffer layer positioned on the first buffer layer. The invention also includes a semiconductor layer positioned on the second buffer layer, and a gate electrode positioned on the semiconductor layer.

The present invention also discloses a flat panel display including a substrate including an emission region and a non-emission region, and a first buffer layer comprising amorphous silicon positioned on the non-emission region of the substrate and exposing the emission region of the substrate. The invention also includes a second buffer layer positioned on at least the first buffer layer, and a semiconductor layer formed on the second buffer layer. The invention additionally includes a gate electrode formed on the semiconductor layer.

The present invention also discloses a method of fabricating a thin film transistor (TFT) including forming a first buffer layer including amorphous silicon layer on a substrate, and forming a second buffer layer on the first buffer layer. The invention also includes forming a semiconductor layer on the second buffer layer, and forming a gate electrode on the semiconductor layer.

The present invention also discloses a method of fabricating a flat panel display including forming a substrate having an emission region and a non-emission region, and forming a first buffer layer comprising amorphous silicon on the substrate. The invention also includes patterning the first buffer layer to expose the emission region of the substrate, and forming a second buffer layer on at least the first buffer layer. The invention additionally includes forming a thin film transistor on the second buffer layer, and forming a pixel electrode electrically coupled to the thin film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 1A:
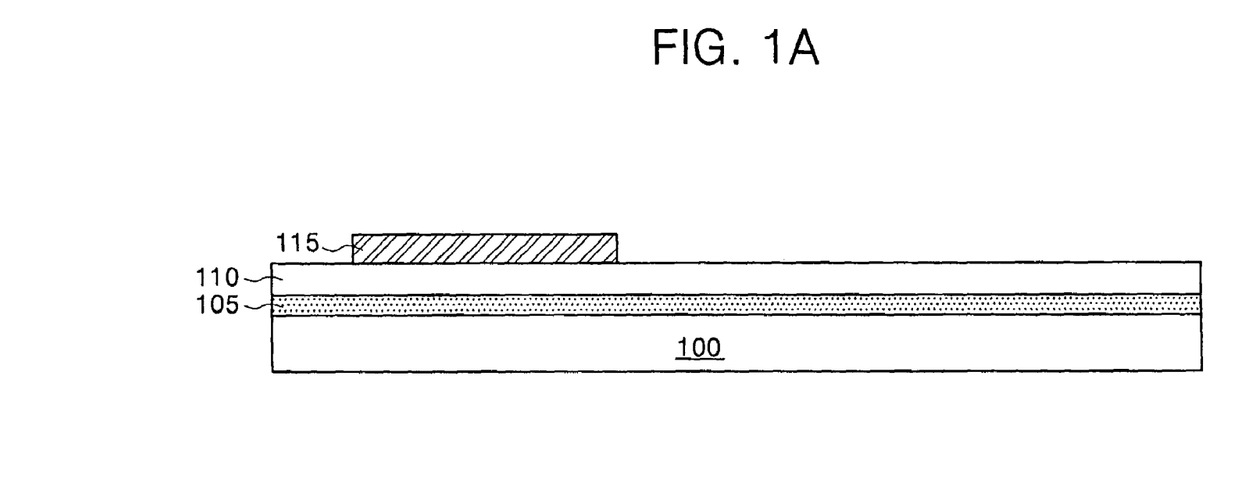
FIG. 1A, FIG. 1B, and FIG. 1C are cross-sectional views showing a method of fabricating a TFT in accordance with a first embodiment of the present invention.
Figure 1B:
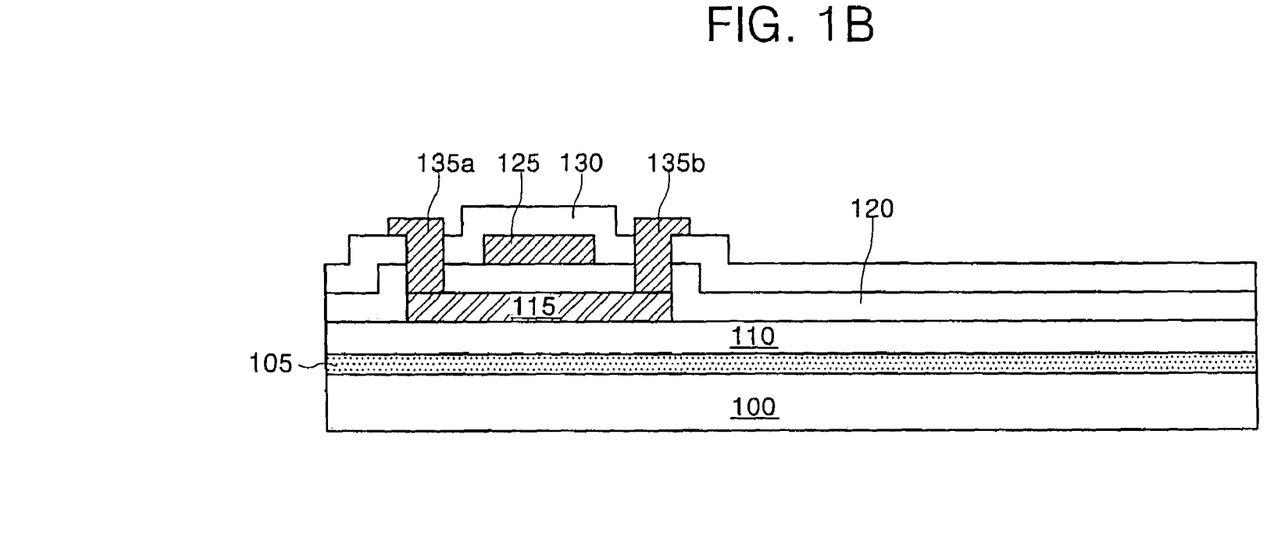
Figure 1C:
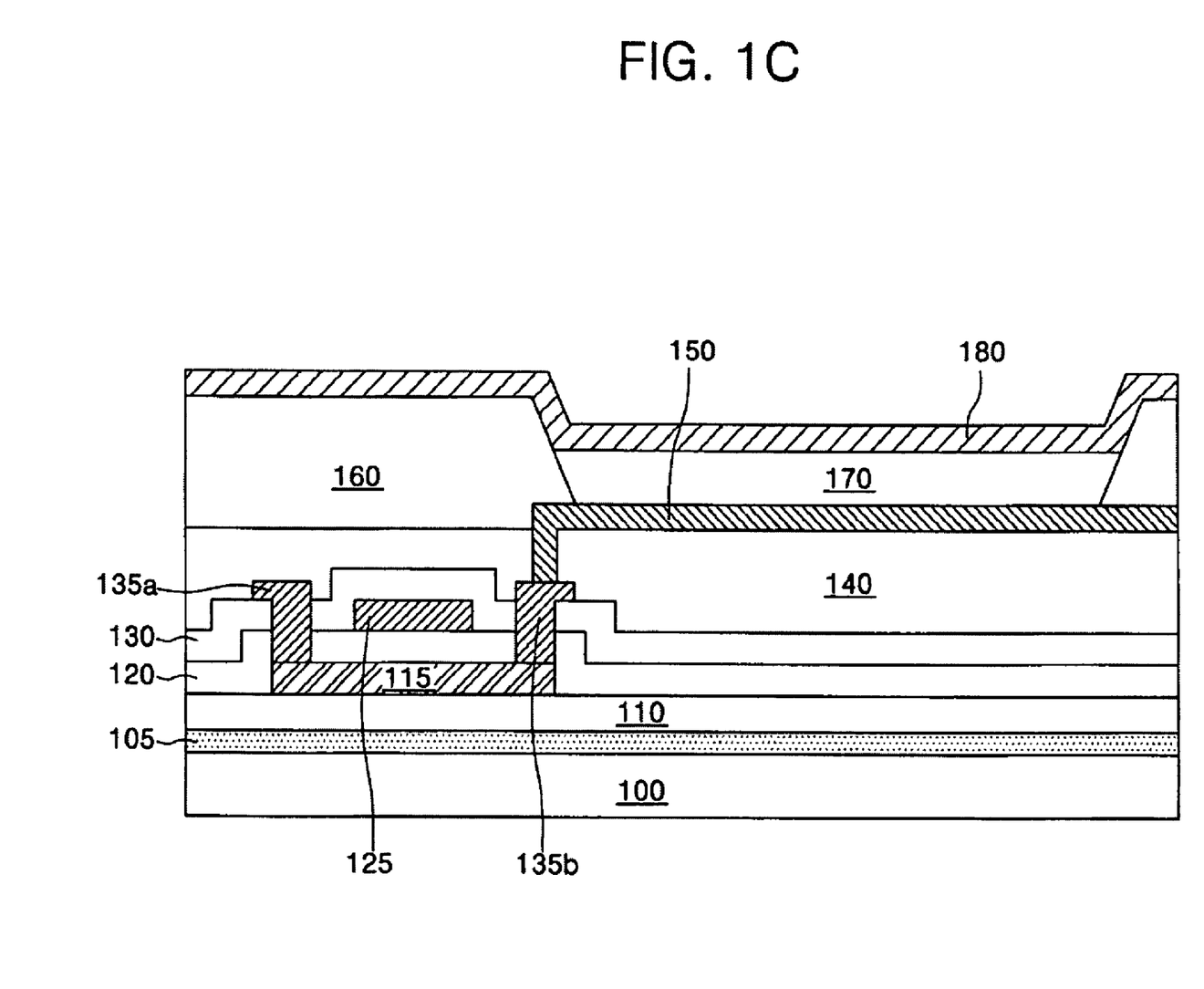

FIG. 1A, FIG. 1B, and FIG. 1C are cross-sectional views showing a method of fabricating a TFT in accordance with an embodiment of the present invention. Referring to FIG. 1A, an amorphous silicon layer is formed as a first buffer layer 105 on a substrate 100. The amorphous silicon layer is preferably formed by a chemical vapor deposition (CVD) method. The CVD method may be any CVD method, such as a low pressure CVD (LPCVD) method, an atmospheric pressure CVD (APCVD) method or a plasma enhanced CVD (PECVD) method. Additionally, $SiH_4$ gas may be used in conjunction with the CVD method, and the resulting amorphous silicon layer that becomes the first buffer layer 105 may be formed containing hydrogen. Also, the first buffer layer 105 may be formed to be about 500 Å to about 1000 Å thick.

The amorphous silicon layer forming the first buffer layer 105 may have a transmissivity of about 50%, which at least partially blocks external light. The first buffer layer 105 may also at least partially block light reflected to the outside of the flat panel display due to interconnection lines and metal layers of TFT in the display. Unwanted external light and light reflected to the outside reduces contrast of the display, and reducing such unwanted light improves the contrast ratio of the resulting display device. In addition, the contrast ratio of light emitted from the display device is reduced by the reflection of external light due to metal electrodes in the emission region, and the partial transmissivity of the amorphous silicon layer reduces such reflections so that the contrast ratio may be enhanced without requiring polarizers arranged outside the display.

After the first buffer layer 105 is formed, a second buffer layer 110 is formed on the first buffer layer 105. The second buffer layer 110 may be formed by any CVD method. Additionally, the second buffer layer 110 may be formed of a silicon oxide (e.g. $SiO_2$) layer or a silicon nitride ($SiN_x$) layer, and is preferably formed of silicon oxide (e.g. $SiO_2$). The thickness of the second buffer layer may be about 1000 Å to about 3000 Å. It should be noted that the second buffer layer 110 preferably has a thickness of at least 1000 Å in order to better block alkaline and other impurities that may diffuse from the substrate into adjacent semiconductor layers.

An amorphous silicon layer is formed over a portion of the second buffer layer 110. The amorphous silicon layer may be formed by a CVD method, such as a LPCVD method, an APCVD method, and a PECVD method. The amorphous silicon layer is crystallized and then patterned to form a semiconductor layer 115. The crystallization method may be any of an excimer laser annealing (ELA) method, a Sequential Lateral Solidification (SLS) method, a metal induced crystallization (MIC) method, and a metal induced lateral crystallization (MILC) method.

The crystalline silicon layer is patterned after the crystallization process to thereby form the semiconductor layer 115.

Alternatively, the semiconductor layer 115 may be formed such that an amorphous silicon layer is first formed, patterned, and then crystallized.

Referring to FIG. 1B, a gate insulating layer 120 is deposited on the semiconductor layer 115 and second buffer layer 110. The gate insulating layer 120 may be made of any well known dielectric material appropriate for a gate insulator, such as, for example, silicon oxide (e.g. $SiO_2$) or silicon nitride ($SiN_x$).

A gate electrode 125 may then be formed on the gate insulating layer 120. The gate electrode 125 may be formed by having a conductive layer first formed on a portion of the gate insulating layer 120 above the semiconductor 115 layer and then patterning the conductive layer. The conductive layer may be a metal, a crystalline silicon material, and a transparent conductive material.

After the gate electrode 125 is formed, ions are implanted into a portion of the semiconductor layer 115 using the gate electrode 125 as a mask. By means of the ion implantation, a source region and a drain region are formed in the semiconductor layer 115 so that the semiconductor layer 115 includes a source region, a drain region, and a channel region therebetween. An interlayer insulating layer 130 is then formed over and on each side of the gate electrode 125. The interlayer insulating layer 130 may be made of any appropriate dielectric material, such as, for example, silicon oxide (e.g. $SiO_2$) or silicon nitride ($SiN_x$).

Contact holes are formed on either side of the gate electrode 125 through the interlayer insulating layer 130 and gate insulating layer 120 to expose the source and drain regions of the semiconductor layer 115. A conductive layer is then deposited and patterned on the interlayer insulating layer 130 and within the contact holes to form a source electrode 135a and a drain electrode 135b. The source electrode 135a is in electrical contact with the source region of the semiconductor layer 115 and the drain electrode 135b is in electrical contact with the drain region. The conductive layer may be formed from a conductive material selected from a group of conductive materials consisting of a metal, a crystalline silicon, and a transparent conductor.

Referring to FIG. 1C, an insulating layer 140 is formed on the interlayer insulating layer 130, and the insulating layer 140 is subject to thermal treatment. In the embodiment shown in FIG. 1C, hydrogen remaining in the amorphous silicon of the first buffer layer 105 may diffuse and penetrate into the second buffer layer 110 and further diffuse into the crystalline silicon of the semiconductor layer 115. As a result of the migrating hydrogen, defects formed in the crystalline silicon of the semiconductor layer 115 after the crystallization process has been carried out are passivated by the hydrogen.

Hydrogen passivation of the semiconductor layer 115 leads to a reduction of defects in the semiconductor layer 115. By reducing defects in the semiconductor layer 115, stable and/or improved electrical properties may be obtained for the resulting TFT. For example, due to passivation by hydrogen migrating into the semiconductor layer 115, problems such as threshold voltage instability and mobility reduction due to crystallization defects of the semiconductor layer 115 may be improved. It should be noted that in embodiments where the first buffer layer 105 is over 1000 Å thick, excessive hydrogen may be introduced into the semiconductor layer 115. Excessive hydrogen in the semiconductor layer 115 should be reduced or avoided because it will degrade the semiconductor properties of the semiconductor layer 115 when the passivation is carried out. Accordingly, the thickness of the first buffer layer 105 is preferably between about 500 Å to about 1000 Å.

After via holes are formed in the insulating layer 140, a pixel electrode 150 is formed over a portion of the insulating layer 140. Additionally, the pixel electrode 150 is formed in electrical contact with either the drain electrode 135b or the source electrode 135a. In particular, it should be noted that when the TFT of the present invention is incorporated into a flat panel display device, either the source electrode 135a or the drain electrode 135b may be selected to be coupled to the pixel electrode 150. After the pixel electrode 150 is formed, an insulating layer is formed on the pixel electrode 150. The insulating layer is patterned to leave a pixel opening region which leaves a portion of the pixel electrode 150 exposed, the insulating layer with the pixel opening region form a pixel defining layer (PDL) 160. A top surface of the pixel defining layer 160 may be higher than the upper surface of the pixel electrode 150, and the pixel electrode 150 is exposed below the pixel opening region.

After the pixel defining layer 160 is formed, an emission layer 170 is formed on the exposed portion of the pixel electrode 150, and a counter electrode 180 is formed on the emission layer 170 to thereby complete the flat panel display. The flat panel display fabricated by the above method may be either an organic electroluminescence display (OELD) or a liquid crystal display.

When the flat panel display is an OELD type of flat panel display, at least one organic material layer made from an organic material selected from a group of organic material consisting of a hole injecting material, a hole transport material, a hole blocking material, and an electron injecting material may be formed above or below the emission layer 170. In addition, the counter electrode 180 of an OELD type flat panel display may function as either a cathode or an anode of the OELD, and, along with the pixel electrode 150, acts as an electrode of the OELD.

FIG. 1C shows a cross-sectional view of an embodiment of the invention, which is a flat panel display manufactured as described above. The flat panel display includes a first buffer layer 105 formed of an amorphous silicon layer, which is positioned on a substrate 100. The first buffer layer 105 may contain hydrogen and preferably be about 500 Å to about 1000 Å thick. A thickness of about 500 Å to about 1000 Å for the first buffer layer 105 is preferred because excessive hydrogen will be introduced into an adjacent semiconductor layer during passivation if the first buffer layer 105 has a thickness exceeding about 1000 Å.

As stated above, the presence of excess hydrogen during passivation will degrade the adjacent semiconductor layer's electrical properties. More specifically, hydrogen contained in the first buffer layer 105 tends to passivate certain dangling bonds remaining in the adjacent semiconductor layer during subsequent thermal treatment which reduces defects in the semiconductor layer. In addition, the transmissivity of the amorphous silicon layer of the first buffer layer 105 is preferably about 50%, which leads to blocking of external light. By blocking external light, diffuse light reflection problems due to external light reflecting from the TFTs and interconnection lines of the flat panel display are reduced. Furthermore, the reflection of external light due to metal electrodes in the emission region of the display is reduced by the low transmissivity of the first buffer layer 105 so that the contrast ratio of the display device may be improved. Thus, a polarizer arranged outside the display to reduce unwanted reflections and improve the contrast ratio of the display is not needed.

A second buffer layer 110 is positioned on the first buffer layer 105. The second buffer layer 110 may be formed of silicon oxide, (e.g. $SiO_2$) or silicon nitride ($SiN_x$), and is preferably formed of silicon oxide, (e.g. $SiO_2$). The second buffer layer 110 may be about 1000 Å to about 3000 Å thick, and preferably has a thickness of at least 1000 Å to better block impurities which may diffuse from the underlying substrate 100 through the second buffer layer 110 to adjacent layers. A semiconductor layer 115 is positioned on the second buffer layer 110. The semiconductor layer 115 may be formed of crystallized amorphous silicon.

A gate insulating layer 120 is positioned over the second buffer layer 110 and the semiconductor layer 115. A gate electrode 125 is positioned on the gate insulating layer 120 over the semiconductor layer 115. An interlayer insulating layer 130 is formed on the gate insulating layer 120 over the gate electrode 125. In addition, a source electrode 135a and a drain electrode 135b are positioned through contact holes in the interlayer insulating layer 130 and gate insulating layer 120 to couple to the semiconductor layer 115.

An insulating layer 140 is positioned over the upper portion of the source electrode 135a and drain electrode 135b and over the interlayer insulating layer 130. A via hole for exposing the drain electrode 135b of the TFT is formed through the insulating layer 140, and a pixel electrode 150 is located in electrical contact with the drain electrode 135b exposed through the via hole. Alternatively, the via hole may expose the source electrode 135a, and the pixel electrode 150 disposed in electrical contact thereto. a10-0041

A pixel defining layer (PDL) 160 is formed on edges of the pixel electrode 150 which leaves a portion of the pixel electrode 150 exposed through a pixel opening region. The pixel defining layer 160 thus defines a pixel opening region of the pixel electrode 150 by leaving a portion of the pixel electrode 150 exposed. The pixel defining layer 160 also covers a portion of the insulating layer 140 not covered by the pixel electrode 150. An emission layer 170 is positioned on the exposed portion of the pixel electrode 150 within the pixel opening region, and a counter electrode 180 is disposed on the emission layer 170 and the pixel defining layer 160 to thereby complete the flat panel display. The flat panel display may be either an organic electroluminescence display (OELD) or a liquid crystal display (LCD).

When the flat panel display is an OELD, at least one organic material selected from a group of organic materials consisting of a hole injecting material, a hole transport material, a hole blocking material, and an electron injecting material may form an organic material layer above or below the emission layer 170. When the organic layer is present, the counter electrode 180 may function as either a cathode or an anode of the OELD. Accordingly, the organic layer acts as an electrode of the OELD along with the pixel electrode 150.

Figure 2A:
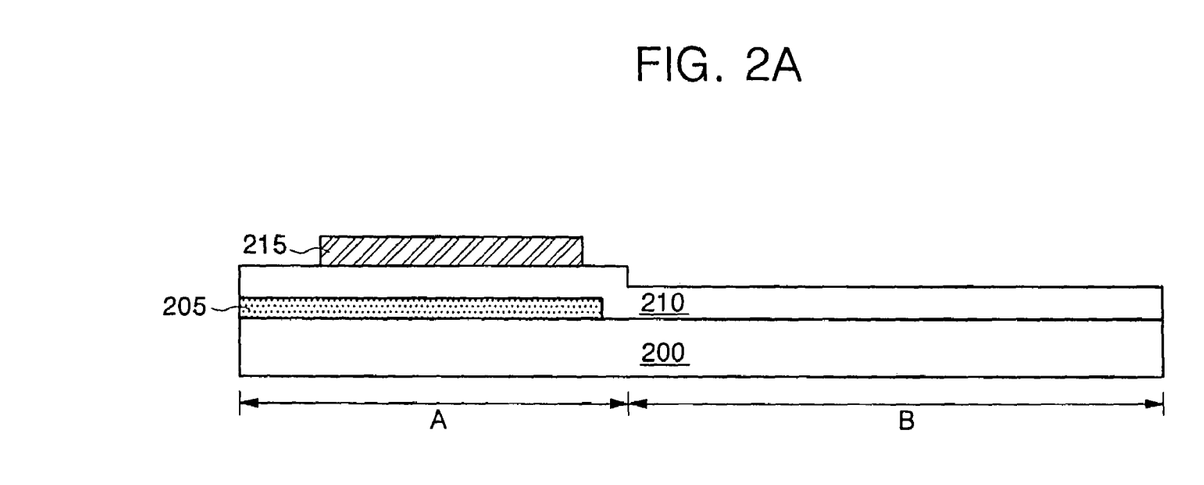
FIG. 2A, FIG. 2B, and FIG. 2C are cross-sectional views for showing a method of fabricating a TFT in accordance with a second embodiment of the present invention.
Figure 2B:
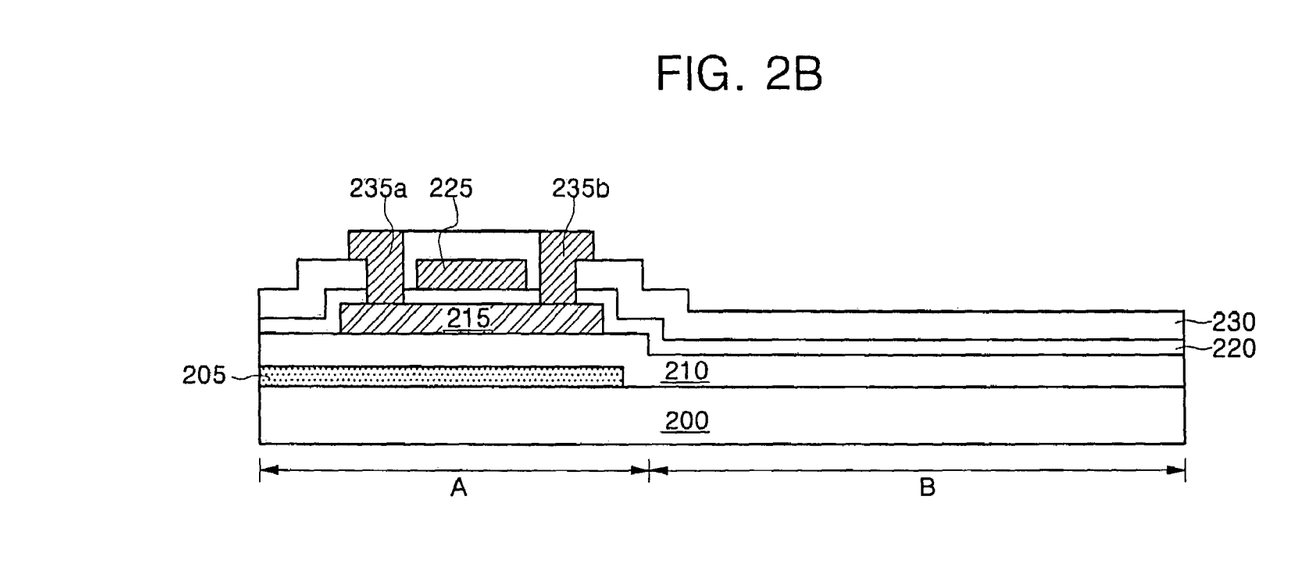
Figure 2C:
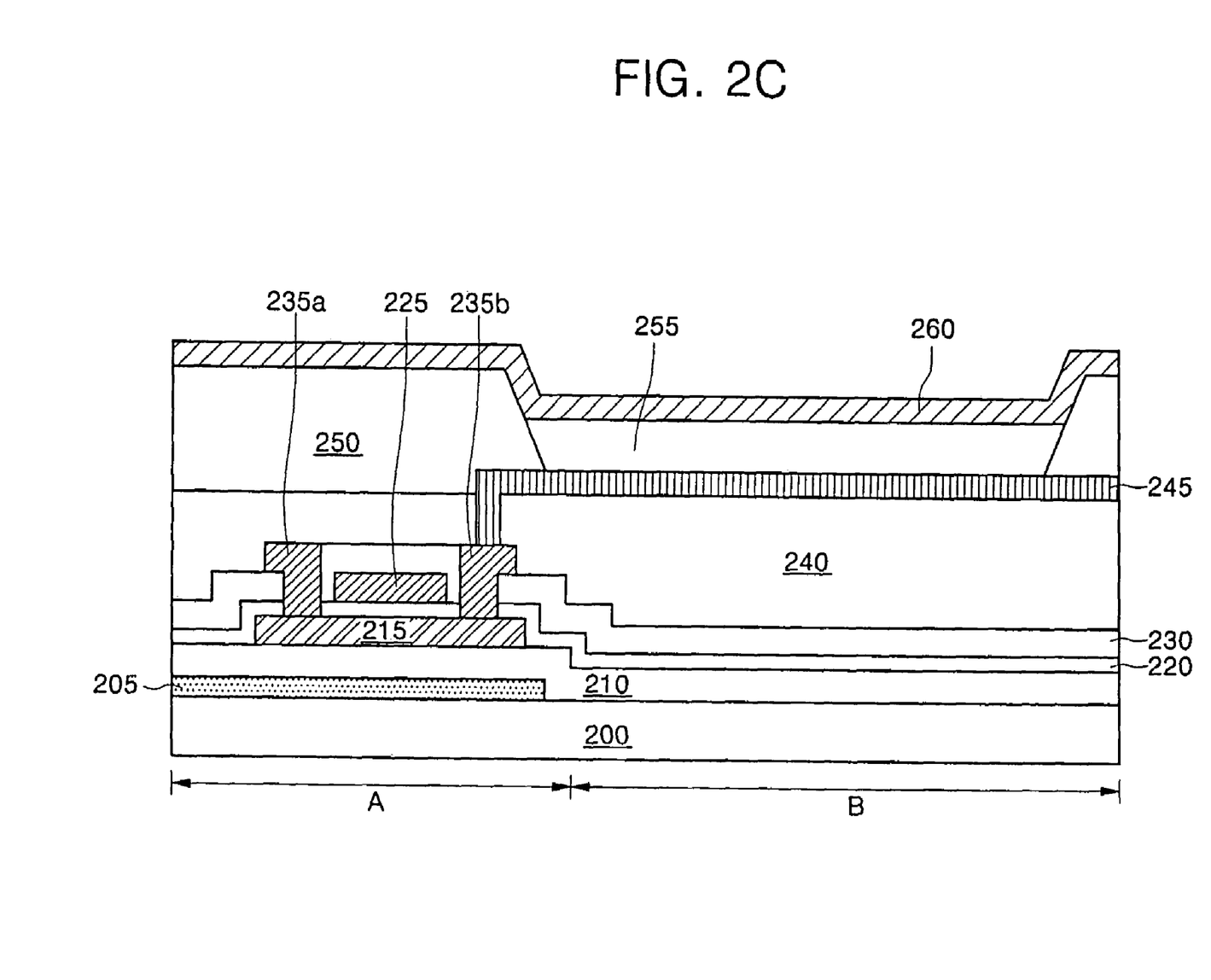

FIG. 2A, FIG. 2B, and FIG. 2C are cross-sectional views illustrating a method of fabricating a TFT in accordance with a second embodiment of the present invention.

Referring to FIG. 2A, a substrate 200 has an emission region B and a non-emission region A. A first buffer layer 205 may be formed of an amorphous silicon in the non-emission region A and the emission region B of the substrate 200. The amorphous silicon for the first buffer layer 205 is preferably formed by a chemical vapor deposition (CVD) process. The CVD process may be any CVD process, such as a low pressure CVD (LPCVD) process, an atmospheric pressure CVD (APCVD) process, and a plasma enhanced CVD (PECVD) process. $SiH_4$ gas may also be used in the CVD process causing the first buffer layer 205 to be formed to contain hydrogen.

The deposited amorphous silicon layer is patterned after deposition to form the first buffer layer 205. In some embodiments, such as the embodiment shown in FIG. 2A, for example, in order to further enhance the transmissivity of emitted light, the amorphous silicon deposited in the emission region B is removed. Thus, no first buffer layer 205 is formed on the emission region B of the substrate 200. In addition, the first buffer layer 205 may be about 500 Å to about 1000 Å thick.

It should be noted that the transmissivity of the amorphous silicon forming the first buffer layer 205 is low. Consequently, the first buffer layer 205 may block at least some light external to the flat panel display. Additionally, the first buffer layer 205 may block at least some of the light that is incident into the flat panel display and reflected to the outside by various reflective layers formed in the flat panel display By blocking at least some of the external and internally reflected light, the contrast ratio of the flat panel display may be improved. Thus, the additional steps for forming a black matrix in the first buffer layer 205 are beneficial but not required and may be eliminated to simplify the total process.

A second buffer layer 210 is formed on the patterned first buffer layer 205 and the substrate 200. The second buffer layer 210 may be formed by any CVD process, such as a LPCVD process, a APCVD process, or a PECVD process.

The second buffer layer 210 may be formed of silicon oxide, (e.g. $SiO_2$) or silicon nitride ($SiN_x$), and the thickness of the second buffer layer 210 may be from about 1000 Å to about 3000 Å. The second buffer layer 210 preferably has a thickness of at least 1000 Å to better block alkaline impurities which may otherwise diffuse from the substrate 200 into a subsequently formed semiconductor layers. Additionally, the second buffer layer 210 is preferably formed of silicon oxide (e.g. $SiO_2$).

An amorphous silicon layer is then formed on the second buffer layer 210 in the region of the first buffer layer 205. The amorphous silicon may be formed by a CVD process including any CVD process of a LPCVD process, a APCVD process, and a PECVD process. After the amorphous silicon layer is deposited, the amorphous silicon is crystallized. The amorphous silicon may be crystallized by any crystallization method, such as an excimer laser annealing (ELA) method, a Sequential Lateral Solidification (SLS) method, a metal induced crystallization (MIC) method, or a metal induced lateral crystallization (MILC) method. After the amorphous silicon layer is crystallized, the resulting crystalline silicon layer is patterned to form a semiconductor layer 215. In an alternate embodiment, the semiconductor layer 215 may be formed by first forming and patterning the amorphous silicon layer, and then crystallizing the patterned amorphous silicon.

After the amorphous silicon layer is deposited, the amorphous silicon is crystallized. The amorphous silicon may be crystallized by any crystallization method of an excimer laser annealing (ELA) method, a Sequential Lateral Solidification (SLS) method, a metal induced crystallization (MIC) method, and a metal induced lateral crystallization (MILC) method. After the amorphous silicon layer is crystallized, the resulting crystalline silicon layer is patterned to form a semiconductor layer 215. In an alternate embodiment, the semiconductor layer 215 may be formed by first forming and patterning the amorphous silicon layer, and then crystallizing the patterned amorphous silicon.

Referring to FIG. 2B, a gate insulating layer 220 is formed on the semiconductor layer 215 and the second buffer layer 210. The gate insulating layer 220 may be made of a dielectric material, such as, for example, silicon oxide, e.g. ($SiO_2$) or silicon nitride ($SiN_x$).

A gate electrode 225 is then formed on the gate insulating layer 220 over the semiconductor layer 215. The gate electrode 225 may be formed from a conductive layer which is first formed and then patterned. The material for the conductive layer may be any conductive material selected from a group of conductive materials consisting of a metal, crystalline silicon, and a transparent conductive material.

After the gate electrode 225 is formed, ions are implanted into the semiconductor layer 215 using the gate electrode 225 as a mask. The ion implantation forms a source region and a drain region in the semiconductor layer 215 so that the semiconductor layer 215 includes a source region, a drain region, and a channel region therebetween. An interlayer insulating layer 230 is formed over the gate insulating layer 220 and the gate electrode 225. The interlayer insulating layer 230 may be made of a dielectric material, such as, for example, silicon oxide, (e.g. $SiO_2$) or silicon nitride ($SiN_x$).

After the interlayer insulating layer 230 is formed, contact holes are formed therethrough to expose the source region and the drain region of the semiconductor layer 215. A conductive layer is then deposited and patterned on the interlayer insulating layer 230 and within the contact holes to form a source electrode 235a and a drain electrode 235b. The source electrode 235a and the drain electrode 235b are electrically coupled to the source and drain regions, respectively. The conductive layer may be made of such material as metal, crystalline silicon, and a transparent conductive material.

FIG. 2C shows the source electrode 235a the drain electrode 235b of the TFT connected to a pixel electrode 245.

More specifically, FIG. 2C shows a passivation layer 240 formed on the interlayer insulating layer 230 and the source electrode 235a and the drain electrode 235b, and subjected to a thermal treatment. In the embodiment shown, hydrogen remaining in the amorphous silicon of the first buffer layer 205 migrates into the second buffer layer 210 and diffuses into the crystalline silicon of the semiconductor layer 215. As a result of hydrogen diffusing into semiconductor layer 215, defects formed in the crystalline silicon after the crystallization process are passivated by the hydrogen. The hydrogen passivation of the crystalline silicon leads to a reduction of the defects in the semiconductor layer 215.

It should be noted that when the first buffer layer 205 is over about 1000 Å thick, excessive hydrogen may be introduced into the semiconductor layer 215 which may degrade the semiconductor's electrical properties when the passivation is carried out. Accordingly, of the first buffer layer 205 is preferably about 500 Å to about 1000 Å thick in order to reduce hydrogen migrating from the first buffer layer 205 into the semiconductor layer 215. As a result of the passivation, crystallization defects of the semiconductor layer 215 may be reduced and the threshold voltage is made more stable and hole and electron mobility is increased. Accordingly, a semiconductor layer 215 having relatively stable electrical properties may be produced.

A via hole is then formed in the passivation layer 240, and a pixel electrode 245 is formed in electrical contact with the drain electrode 235b. It should be noted that the pixel electrode 245 may be coupled to either the source electrode 235a, or the drain electrode 235b by forming the via hole in a suitable location. An insulating layer is formed on the pixel electrode 245. The insulating layer is patterned in a region above the pixel electrode 240 to form a pixel defining layer (PDL) 250 having a pixel opening region. As a result, the pixel electrode 245 is exposed below the pixel opening region of the pixel defining layer 250. An emission layer 255 is then formed on the portion of the pixel electrode 245 exposed through the pixel opening region of the pixel defining layer 250. A counter electrode 260 is then formed on the emission layer 255 to complete the flat panel display.

The flat panel display may be an organic electroluminescence display (OELD) or a liquid crystal display. When the flat panel display is an OELD flat panel display, at least one organic material selected from a group of organic materials consisting of a hole injecting material, a hole transport material, a hole blocking material, and an electron injecting material may additionally form a layer above or below the emission layer 255. With the additional organic material layer, the counter electrode 260 may function as either a cathode or an anode of the OELD, and, along with the pixel electrode 245, generally acts as an electrode of the OELD.

FIG. 2C also shows a cross-sectional view of a flat panel display apparatus in accordance with a method of fabrication as described above. The flat panel display has a first buffer layer 205 formed of an amorphous silicon material which is positioned on a substrate 200 having an emission region B and a non-emission region A. The first buffer layer 205 is positioned substantially only in the non-emission region A so as to further enhance transmissivity of emitted light, and may contain hydrogen.

A second buffer layer 210 is positioned on the first buffer layer 205 and over portions of the substrate 200. The second buffer layer 210 may be formed of silicon oxide (e.g. $SiO_2$) or silicon nitride ($SiN_x$), and may have a thickness of about 1000 Å to about 3000 Å. The second buffer layer 210 preferably has a thickness of at least 1000 Å in order to better block impurities migrating from lower layers into upper layers through the second buffer layer 210. The second buffer layer 210 is preferably formed of silicon oxide (e.g. $SiO_2$).

A semiconductor layer 215 is positioned on the second buffer layer 210 over the first buffer layer 205. The semiconductor layer 215 may be formed from amorphous silicon which is first formed on the second buffer layer 210 and then is crystallized. The crystallization method may be any crystallization method, such as an excimer laser annealing (ELA) method, a Sequential Lateral Solidification (SLS) method, a metal induced crystallization (MIC) method, or a metal induced lateral crystallization (MILC) method.

It should be noted that hydrogen contained in the first buffer layer 205 may diffuse into the semiconductor layer 215 and passivate dangling bonds remaining in the semiconductor layer 215 in subsequent thermal treatment and thereby reduce defects in the semiconductor layer 215. However, when the first buffer layer 205 has a thickness exceeding about 1000 Å, excessive hydrogen may be introduced into the semiconductor layer 215 when the passivation process is carried out causing degradation of the semiconductor properties of the semiconductor layer 215. Accordingly, it is preferable to form the first buffer layer 205 to be about 500 Å to about 1000 Å thick. In addition, the amorphous silicon material forming the first buffer layer 205 blocks at least some of external light due to its low transmissivity. Thus, the first buffer layer 205 may act as a black matrix for improving display contrast by reducing the reflection of light due to TFT and interconnection lines in the flat panel display.

A gate insulating layer 220 is positioned over the semiconductor layer 215 and the second buffer layer 210. A gate electrode 225 is positioned on the gate insulating layer 220 over the semiconductor layer 215. An interlayer insulating layer 230 is formed on the gate insulating layer 220 and over the gate electrode 225. Additionally, a source electrode 235a and a drain electrode 235b are formed in via holes through the interlayer insulating 230 and gate insulating layer 220 to electrically couple to a source and a drain in the semiconductor layer 215, respectively.

A passivation layer 240 is disposed on the source electrode 235a and the drain electrode 235b and over the interlayer insulating layer 230. A via hole for exposing the drain electrode 235b of the TFT is formed in the passivation layer 240, and a pixel electrode 245 is coupled to the drain electrode 235b through the via hole. In an alternate embodiment, a via hole may be formed through the passivation layer 240 to the source electrode 235a, and a pixel is electrode coupled to the source electrode 235a.

A pixel defining layer (PDL) 250 is positioned on the pixel electrode 245. After the pixel defining layer 250 is formed, the pixel electrode 245 is exposed along a pixel opening region defined by the pixel defining layer 250. An emission layer 255 is then positioned on the exposed region of the pixel electrode 245, and a counter electrode 260 is positioned on the emission layer 255 to complete the flat panel display. The flat panel display may be an organic electroluminescence display (OELD) or a liquid crystal display.

When the flat panel display is an OELD, at least one organic material selected from a group of organic materials consisting of a hole injecting material, a hole transport material, a hole blocking material, and an electron injecting material may be further formed above or below the emission layer 255. In addition, the counter electrode 260 may function as either a cathode or an anode of the OELD, and, along with the pixel electrode 245, acts as an electrode of the OELD.

As discussed above, a TFT, a flat panel display incorporating the TFT and a method of manufacturing both has a dual buffer layer formed on the entire surface of the substrate and includes amorphous silicon in one layer of the dual buffer layers. The amorphous silicon layer blocks at least a portion of external light. Accordingly, diffuse reflection caused by light reflecting from the layers formed in the flat panel display is reduced or eliminated. Reducing such unwanted reflections enhances the contrast ratio of the flat panel display without requiring a polarizer which reduces the manufacturing costs and improves productivity.

It should also be noted that when the source electrode and the drain electrode are subject to contact thermal treatment, hydrogen remaining in the amorphous silicon of the first buffer layer may diffuse into the crystalline silicon of the semiconductor layer and reduce defects therein. In other words, a hydrogen passivation effect may be obtained by means of hydrogen remaining in the buffer layer formed of the amorphous silicon layer without requiring a separate hydrogen passivation process which is generally employed in a low temperature polysilicon (LTPS) process. In addition, the patterned amorphous silicon layer is used as a buffer layer, and an extra process for forming the black matrix is not required with a corresponding reduction in manufacturing costs and improvement in productivity.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor (TFT), comprising:
a substrate;
a first buffer layer of amorphous silicon positioned on the substrate;
a second buffer layer positioned on the first buffer layer;
a semiconductor layer positioned on the second buffer layer; and
a gate electrode positioned on the semiconductor layer,
wherein the second buffer layer comprises silicon nitride ($SiN_x$).

2. The TFT of claim 1, wherein the first buffer layer is about 500 Å to about 1000 Å thick.

3. The TFT of claim 1, wherein the semiconductor layer comprises polycrystalline silicon.

4. The TFT of claim 1, wherein the second buffer layer is about 1000 Å to about 3000 Å thick.

5. The TFT of claim 1, wherein the first buffer layer comprises hydrogen.

6. A flat panel display, comprising:
a substrate including an emission region and a non-emission region;
a first buffer layer comprising amorphous silicon positioned on the non-emission region of the substrate and exposing the emission region of the substrate;
a second buffer layer positioned on at least the first buffer layer;
a semiconductor layer positioned on the second buffer layer; and
a gate electrode positioned on the semiconductor layer,
wherein the second buffer layer comprises silicon nitride ($SiN_x$).

7. The flat panel display of claim 6, wherein the second buffer layer is about 1000 Å to about 3000 Å thick.

8. The flat panel display of claim 6, wherein the first buffer layer comprises hydrogen.

9. The flat panel display of claim 6, wherein the first buffer layer is about 500 Å to about 1000 Å thick.

10. The flat panel display of claim 6, wherein the semiconductor layer comprises crystallized amorphous silicon.

11. The flat panel display of claim 10, wherein the crystallized amorphous silicon is produced by one of an excimer laser annealing (ELA) method, a sequential lateral solidification (SLS) method, a metal induced crystallization (MIC) method, and a metal induced lateral crystallization (MILC) method.

12. The flat panel display of claim 6, wherein the flat panel display is an organic electroluminescence display and a liquid crystal display.

13. A method for fabricating a thin film transistor (TFT), comprising:
forming a first buffer layer including amorphous silicon layer on a substrate;
forming a second buffer layer positioned on the first buffer layer;
forming a semiconductor layer positioned on the second buffer layer; and
forming a gate electrode positioned on the semiconductor layer,
wherein the second buffer layer comprises silicon nitride ($SiN_x$).

14. The method of claim 13, wherein the first buffer layer comprises hydrogen.

15. The method of claim 13, wherein the first buffer layer is about 500 Å to about 1000 Å thick.

16. The method of claim 13, wherein the second buffer layer is about 1000 Å to about 3000 Å thick.

17. The method of claim 13, wherein forming the semiconductor layer comprises forming and crystallizing an amorphous silicon layer on the second buffer layer.

18. The method of claim 17, further comprising forming a source electrode and a drain electrode in electrical contact with the semiconductor layer.

19. The method of claim 17, wherein forming the crystallized amorphous silicon layer includes any one crystallization process of an excimer laser annealing (ELA) process, a Sequential Lateral Solidification (SLS) process, a metal induced crystallization (MIC) process, and a metal induced lateral crystallization (MILC) process.

* * * * *